United States Patent [19]

Ciambrone

[11] Patent Number: 5,626,280

[45] Date of Patent: May 6, 1997

[54] INFRARED TRANSPARENT SOLDERING TOOL AND INFRARED SOLDERING METHOD

[75] Inventor: David F. Ciambrone, Lake Forest, Calif.

[73] Assignee: HE Holdings, Inc., Los Angeles, Calif.

[21] Appl. No.: 462,721

[22] Filed: Jun. 5, 1995

[51] Int. Cl.$^6$ ................................................ H05K 3/34
[52] U.S. Cl. .................. 228/180.21; 228/212; 228/44.7; 219/85.13
[58] Field of Search ..................... 228/180.21, 105, 228/212, 44.7; 219/85.12, 85.13; 81/488; 250/526

[56] References Cited

U.S. PATENT DOCUMENTS

| Re. 28,798 | 5/1976 | Herring et al. | 437/209 |
|---|---|---|---|
| 3,724,068 | 4/1973 | Galli | 228/180.21 |
| 4,893,742 | 1/1990 | Bullock | 228/1.1 |

*Primary Examiner*—Samuel M. Heinrich
*Attorney, Agent, or Firm*—Leonard A. Alkov; Wanda K. Denson-Low

[57] ABSTRACT

A soldering tool that comprises a selected salt, including Group I and II halides such as potassium chloride, for example, that is transparent to infrared energy. A selected salt is formed into a tool having a specific shape for placement during soldering. The tool is used to position and hold component leads during infrared soldering. The tool is formed into a shape that matches the shape of a component and whose leads are to be soldered. The tool is configured so that it may be disposed over the component so that the tool contacts the leads and causes them to contact pads to which the leads. The tool is reusable in that after showing signs of wear, it may be recycled, reformed, and reused. An infrared soldering method for soldering leads to pads comprises the following steps. The tool is fabricated from a material that is transparent to infrared radiation. The tool formed into a shape that matches the shape of the component and contacts the leads to cause them to contact the pads. The tool is placed over the component so that the tool holds the leads in place. Pressure is applied to the tool to provide force to hold the leads in place on the pads. The component 12 and the tool are then disposed in an inert atmosphere in a infrared reflow soldering machine. The leads are infrared soldered to the pads using the infrared reflow soldering machine.

11 Claims, 2 Drawing Sheets

INFRARED TRANSPARENT SOLDERING TOOL AND INFRARED SOLDERING METHOD

BACKGROUND

The present invention relates generally to soldering, and more particularly, to an infrared soldering tool that is transparent to infrared radiation and that is reusable.

Prior art relating to the present invention involves the use of hot bar reflow soldering and infrared soldering techniques. Infrared soldering of fine leaded packages is very difficult. To obtain a product with all of its leads properly soldered is almost impossible using current infrared soldering techniques. Conventional infrared reflow soldering techniques cannot maintain proper lead geometry or positions during soldering. Hot bar reflow soldering techniques cannot solder an entire printed wiring board at one time.

Therefore, in view of the above, it is an objective of the present invention to provide for an infrared soldering tool and soldering method that permits soldering of all leads while maintaining proper lead geometry, and thus overcomes the limitations of conventional hot bar reflow and infrared soldering techniques. It is a further objective of the present invention to provide for an infrared soldering tool that is transparent to infrared radiation.

SUMMARY OF THE INVENTION

In order to meet the above and other objectives, the present invention comprises a soldering tool that comprises selected salts, such as Group I and II halides, for example, that are transparent to infrared energy. The tool is used to position and hold fine leaded component leads during infrared soldering. A selected salt is formed into a tool or tools having a specific shape or shapes for placement during soldering. Potassium chloride (KCl) has been used in tools that have been reduced to practice. The tools are reusable in that after showing signs of wear, they may be recycled, reformed, and reused.

More particularly, the soldering tool comprises a material that is transparent to infrared radiation formed into a predetermined shape that matches the shape of a component whose leads are to be soldered. The tool is configured so that it may be disposed over the component so that the tool contacts the leads and causes them to contact pads to which they are to be soldered.

The present invention also provides for a method of infrared soldering leads of a leaded component to pads of a printed wiring board. The method comprises the following steps. A soldering tool is fabricated from a material that is transparent to infrared radiation and is formed into a shape that matches the shape of the component and contacts the leads to cause them to contact the pads of the printed wiring board. The tool is placed over the leaded component that is to be soldered so that the tool holds the leads in place. Pressure is applied to the tool to provide force to hold the leads in place on the pads. The component and the tool are then disposed in an inert atmosphere in a infrared reflow soldering machine. The leads are infrared soldered to the pads of the printed wiring board using the infrared reflow soldering machine.

The use of the present infrared tool for infrared reflow soldering offers the following advantages. The tool permits one-time infrared soldering of components with hundreds of leads, for example. The tool permits soldering of very fine leads on packages and leads on large pitch devices. The tool permits design flexibility and the material from which the tools are made is reusable. Improved soldering quality and reliability is achieved by using the present infrared soldering tool. The tool permits a user to solder chip components and large pin count fine leaded deices at the same time. The tool may be adapted to handle leads of various shapes and materials. The present invention permits all leads to be properly placed, and lead shape and solder gap to be properly maintained.

The present invention may be of benefit to any manufacturing process using infrared reflow soldering or leaded and combination chip and leaded components. This includes multichip modules having very fine pitch spacing. The present invention provides a reliable means for holding leads during infrared soldering processes.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
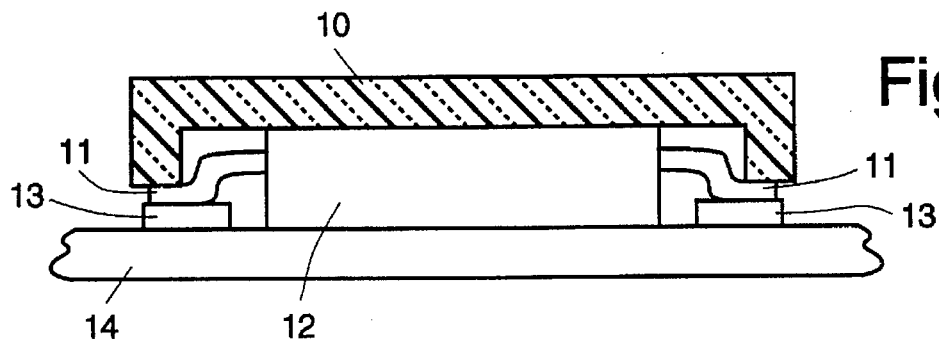
FIG. 1 illustrates a cross sectional side view of an infrared transparent soldering tool used for infrared soldering of leads in accordance with the principles of the present invention.
Figure 2:
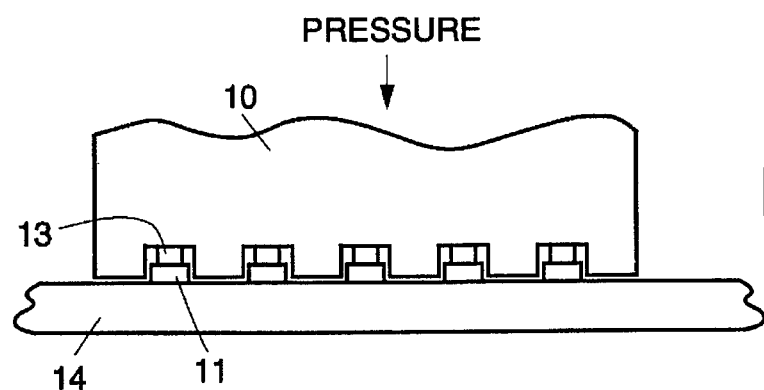
FIG. 2 illustrates an end view of the infrared transparent soldering tool of FIG. 1.
Figure 3:
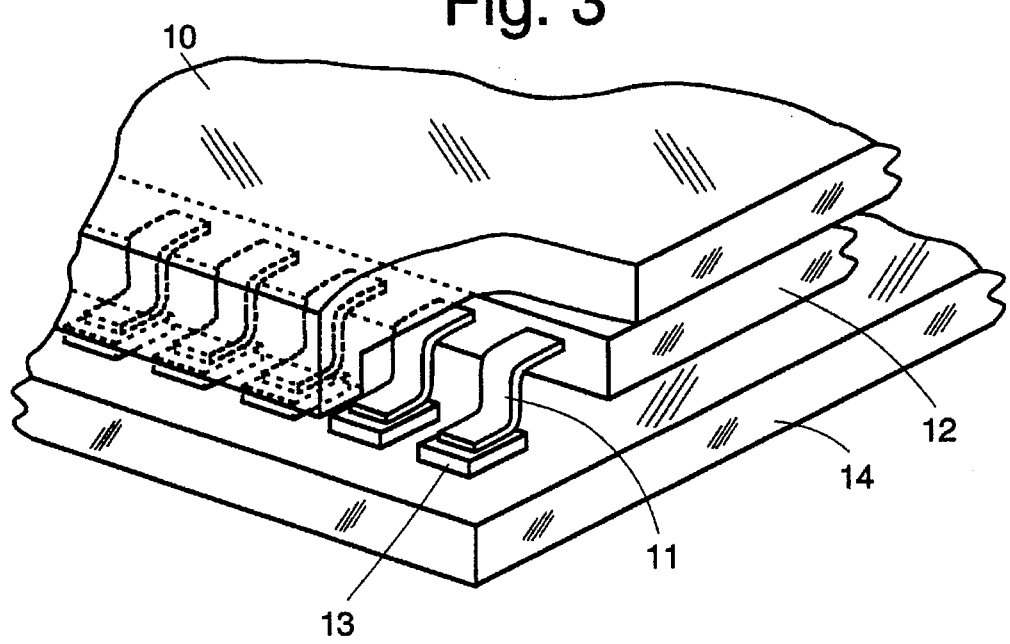
FIG. 3 illustrates a perspective view of the infrared transparent soldering tool of FIG. 1.

Referring to the drawing figures FIG. 1 illustrates a cross sectional side view of an infrared transparent soldering tool 10 in accordance with the principles of the present invention used for infrared soldering of leads 11 of components 12 to pads 13 of printed wiring boards 14, and the like. FIGS. 2 and 3 illustrate end and perspective views of the infrared transparent soldering tool 10. FIG. 2 also shows the manner in which the infrared transparent soldering tool 10 holds leads 11 of a component 12 that is to be soldered to the printed wiring board 14.

The infrared transparent soldering tool 10 is comprised of Group I and II halides and other materials that are transparent to infrared radiation. Potassium chloride (KCl) is one specific material that has been used to fabricate tools 11 in reduced to practice embodiments of the present invention. A selected material is formed into an infrared transparent soldering tool 10 by using a die (not shown) configured to an appropriate shape to match the component 12 and leads 11. The material is formed using the die under pressure to fabricate a tool 10 of the desired configuration. Each different component 12 that is to be soldered has a tool 10 that is shaped to matches it. The tools 10 are stored in a dry environment between uses.

Soldering of leads 11 is accomplished by placing the tool 10 over a leaded component 12 that is to be soldered. The tool 10 holds the leads 11 of the component 12 in place and pressure may be applied to the tool 10 to provide a desired amount of force to hold the leads 11 in place on the pads 13 and to thus properly solder each joint between the leads 11 and the pads 13. The soldering is accomplished in a nitrogen or other inert atmosphere in a belt-type infrared reflow soldering machine (not shown), for example.

As the tools 10 show wear, they may be shaved to remove their contaminated portion, and the contaminated portions can then be discard. The uncontaminated portions of the shaved tools 10 may then be ground up, dried, and reformed into new soldering tools 10, as required. This provides for infrared soldering tools 10 that are recyclable and have flexibility in that they can be reformed into new and different soldering tools 10 having differing shapes and sizes for different soldering tasks.

Figure 4:
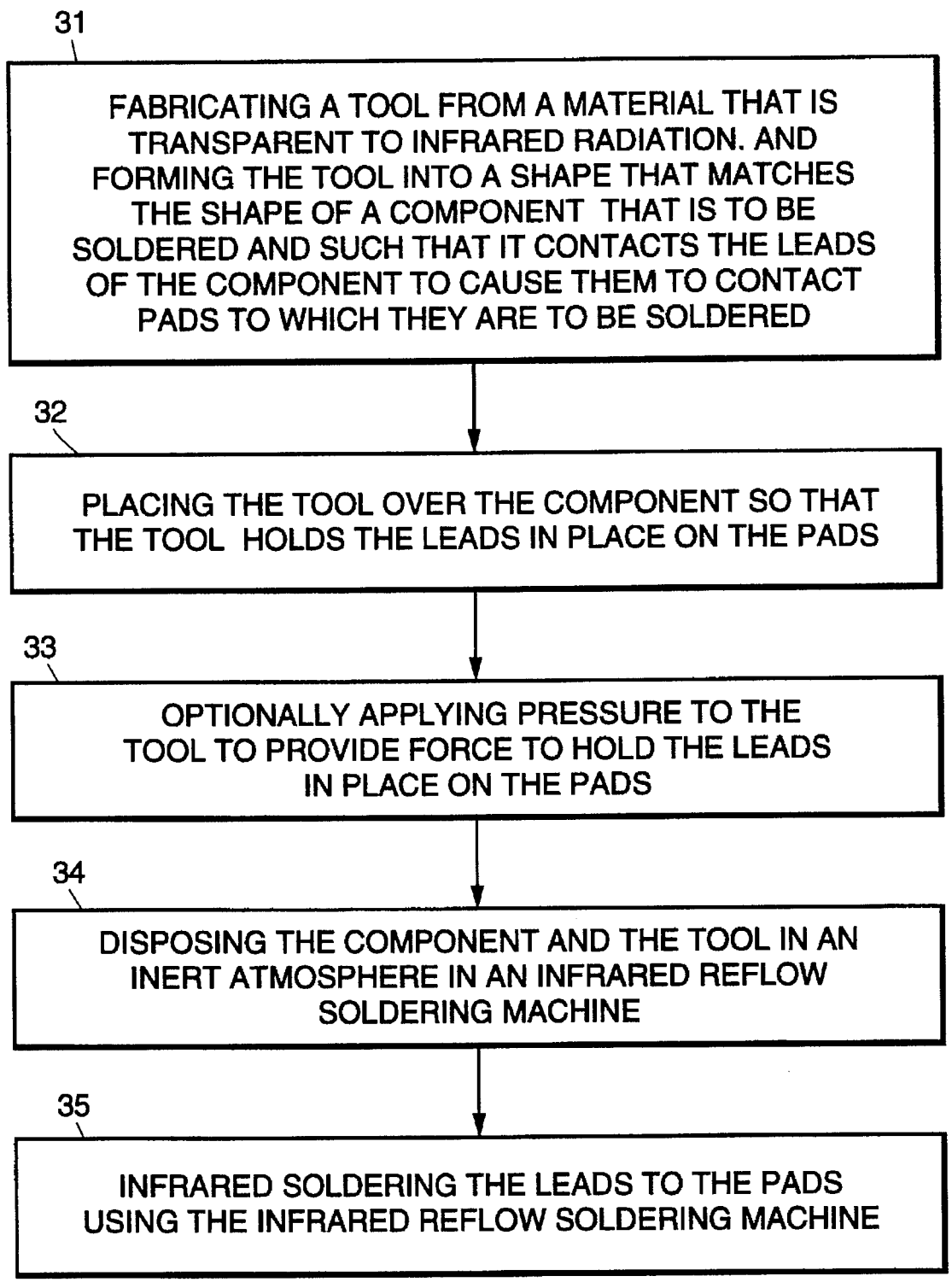
FIG. 4 shows one method in accordance with the principles of the present invention.

Referring to FIG. 4, it shows one infrared soldering method 30 in accordance with the present invention for soldering leads 11 to pads 13. The method 30 comprises the following steps. The tool 10 is fabricated 31 from a material that is transparent to infrared radiation. The tool 10 formed into a shape that matches the shape of the component 12 and contacts the leads 11 to cause them to contact the pads 13. The tool 10 is placed 32 over the component 12 so that the tool 10 holds the leads 13 in place. Pressure 33 is optionally applied to the tool 10 to provide force to hold the leads 11 in place on the pads 13. The component 12 and the tool 10 are then disposed 34 in an inert atmosphere in an infrared reflow soldering machine. The leads 11 are infrared soldered to the pads 13 using the infrared reflow soldering machine.

Thus there has been described a new and improved infrared transparent soldering tool and soldering process. It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. An infrared transparent soldering tool for infrared soldering leads of a component to pads of a printed wiring board, said tool comprising:

a selected material that is transparent to infrared radiation formed into a predetermined shape such that it matches the shape of the component and that may be disposed over the component whose leads are to be infrared soldered to the pads of the printed wiring board, and configured such that the tool contacts the leads and causes the leads to contact the pads of the printed wiring board.

2. The tool of claim 1 wherein the selected material comprises a predetermined Group I halide.

3. The tool of claim 1 wherein the selected material comprises a predetermined Group II halide.

4. The tool of claim 1 wherein the selected material comprises potassium chloride.

5. A method of infrared soldering leads of a component to pads of a printed wiring board, said method comprising the steps of:

fabricating a soldering tool from a selected material that is transparent to infrared radiation that is formed into a predetermined shape such that it matches the shape of the component and that is disposed over the component whose leads are to be soldered to the pads of the printed wiring board, and that is configured such that the tool contacts the leads and causes the leads to contact the pads of the printed wiring board;

placing the tool over a leaded component that is to be soldered such that the tool 10 holds the leads of the component in place;

disposing the leaded component and the tool in an inert atmosphere in a infrared reflow soldering machine; and infrared soldering the leads to the pads of the printed wiring board using the infrared reflow soldering machine.

6. The method of claim 5 wherein the step of disposing the leaded component and the tool in a nitrogen or other inert atmosphere in a belt-type infrared reflow soldering machine in a nitrogen atmosphere.

7. The method of claim 5 wherein the step of infrared soldering the leads comprises the step of infrared soldering the leads in a belt-type infrared reflow soldering machine.

8. The method of claim 5 wherein the step of fabricating a soldering tool from a selected material that is transparent to infrared radiation comprises the step of fabricating the tool from a predetermined Group I halide.

9. The method of claim 5 wherein the step of fabricating a soldering tool from a selected material that is transparent to infrared radiation comprises the step of fabricating the tool from a predetermined Group II halide.

10. The method of claim 5 wherein the step of fabricating a soldering tool from a selected material that is transparent to infrared radiation comprises the step of fabricating the tool from potassium chloride.

11. The method of claim 5 which further comprises the step of applying pressure to the tool to provide a desired amount of force to hold the leads in place on the pads.

* * * * *